United States Patent
Lee et al.

(10) Patent No.: US 8,175,124 B2
(45) Date of Patent: May 8, 2012

(54) FRIT SEALING SYSTEM

(75) Inventors: Jung-Min Lee, Suwon-si (KR);
Hee-Seong Jeong, Suwon-si (KR);
Choong-Ho Lee, Suwon-si (KR);
Jun-Sik Oh, Suwon-si (KR); Je-Kil Ryu, Suwon-si (KR); Won-Kyu Choe, Suwon-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 263 days.

(21) Appl. No.: 12/185,279

(22) Filed: Aug. 4, 2008

(65) Prior Publication Data
US 2009/0233513 A1    Sep. 17, 2009

(30) Foreign Application Priority Data
Mar. 14, 2008   (KR) ................. 10-2008-0023926

(51) Int. Cl.
*H01S 3/10* (2006.01)

(52) U.S. Cl. ................... 372/9; 257/E21.502; 359/621; 445/25

(58) Field of Classification Search ............ 445/24, 445/25, 60; 257/E21.122, E21.502; 359/621; 372/9
See application file for complete search history.

(56) References Cited

U.S. PATENT DOCUMENTS

| | | | |
|---|---|---|---|
| 4,360,372 A * | 11/1982 | Maciejko | 65/402 |
| 6,037,710 A | 3/2000 | Poole et al. | |
| 6,130,970 A | 10/2000 | Hong et al. | |
| 6,272,155 B1 | 8/2001 | Sekiguchi | |
| 6,998,776 B2 | 2/2006 | Aitken et al. | |
| 2003/0016450 A1 | 1/2003 | Bluemel et al. | |
| 2003/0066311 A1 | 4/2003 | Li et al. | |
| 2003/0141521 A1* | 7/2003 | Isobe et al. | 257/200 |
| 2005/0248270 A1* | 11/2005 | Ghosh et al. | 313/512 |
| 2006/0138351 A1* | 6/2006 | Jyumonji et al. | 250/492.2 |
| 2007/0063226 A1* | 3/2007 | Tanaka et al. | 257/213 |
| 2007/0128966 A1 | 6/2007 | Becken et al. | |
| 2007/0237475 A1* | 10/2007 | Morita et al. | 385/115 |
| 2007/0268950 A1* | 11/2007 | Spinelli et al. | 372/99 |

(Continued)

FOREIGN PATENT DOCUMENTS

JP        10-074583 A        3/1998

(Continued)

OTHER PUBLICATIONS

Registration Determination Certificate for Korean Patent Application No. 10-2008-0023926 dated Dec. 23, 2009 by Korean Intellectual Property Office.

(Continued)

*Primary Examiner* — Tuan N. Quach
(74) *Attorney, Agent, or Firm* — Knobbe, Martens, Olson & Bear LLP (57) ABSTRACT

A frit sealing system for combining a first substrate and a second substrate using frit comprises a laser generating a laser beam, and a homogenizer normalizing the intensity of the laser beam within a cross section of the laser beam in the transverse direction. The frit sealing system further comprises a support apparatus configured to hold a first and a second substrate with frit interposed between them, wherein the frit is configured to be cured by heat generated from the laser beam and thereby solidifying and binding the first and the second substrates.

13 Claims, 10 Drawing Sheets

U.S. PATENT DOCUMENTS

2007/0278194 A1* 12/2007 Hoelsher et al. ............ 219/121.6
2008/0267245 A1* 10/2008 Tanaka et al. ................. 372/101

FOREIGN PATENT DOCUMENTS

| | | |
|---|---|---|
| JP | 11-23878 A | 1/1999 |
| JP | 11-500541 A | 1/1999 |
| JP | 2002-328288 A | 11/2002 |
| JP | 2003-019588 A | 1/2003 |
| JP | 2003-112281 A | 4/2003 |
| JP | 2003-123966 A | 4/2003 |
| JP | 2006-075854 A | 3/2006 |
| JP | 2007-237200 A | 9/2007 |
| JP | 2007-260694 A | 10/2007 |
| KR | 10-2005-0016120 A | 2/2005 |
| KR | 10-2007-0078501 | 8/2007 |
| KR | 10-2007-0088682 A | 8/2007 |
| WO | WO 2004/108342 A2 | 12/2004 |

OTHER PUBLICATIONS

European Search Report for European Patent Application No. 09250684.9 dated Jul. 3, 2009 by European Patent Office.

Japanese Office Action dated Nov. 22, 2011 for Japanese Patent Application No. JP 2009-042346 which shares priority of Korean Patent Application No. KR 10-2008-0023926 with captioned U.S. Appl. No. 12/185,279.

Homburg et al., Refractive beam shaping—from Maxwell's Equations to products and applications in laser materials processing, *Proc. of SPIE* vol. 6663, 66630D, (2007) pp. 1-12.

European Examination Report dated Sep. 23, 2011 for European Patent Application EP 09 250 684.9 which shares priority of Korean Patent Application No. KR 10-2008-0023926 with captioned U.S. Appl. No. 12/185,279.

* cited by examiner

FRIT SEALING SYSTEM

CROSS-REFERENCE TO RELATED PATENT APPLICATIONS

This application claims the benefit of Korean Patent Application No. 10-2008-0023926, filed on Mar. 14, 2008, in the Korean Intellectual Property Office, the disclosure of which is incorporated herein in its entirety by reference.

BACKGROUND

1. Field

The present disclosure relates to a frit sealing system, and more particularly, to a frit sealing system to improve the quality of sealing by generating a laser beam of a normalized intensity using a homogenizer.

2. Description of the Related Art

Recently, display devices have been quickly replaced by portable thin flat display devices. The flat display devices include electroluminescent display devices which are self-luminous display devices exhibiting characteristics of a wide viewing angle, a superior contrast, and a fast response time. Thus, the electroluminescent display devices are highly expected as one of the next generation display devices. Also, organic light emitting display devices in which a light emitting layer is formed of organic matter have advantages over inorganic light emitting display devices in terms of brightness, low drive voltage, fast response time, and multicolor capabilities.

A typical organic light emitting display device has a structure in which at least one organic layer including a light emitting layer is interposed between a pair of electrodes, that is, a first electrode and a second electrode. The first electrode is formed on a substrate and functions as an anode to inject holes. The organic layer is formed above the first electrode. The second electrode having a function of a cathode to inject electrons is formed on the organic layer to face the first electrode.

In the organic light emitting display device, when moisture or oxygen comes in from a surrounding environment, the life span of a device is shortened due to oxidation or lamination of electrode material, deterioration of an efficiency of light, and the change in color of emitted light.

Thus, in the manufacturing process of the organic light emitting display device, sealing process is typically performed to prevent intrusion of moisture by isolating the device from the external environment. According to the typical sealing process, organic polymer such as polyester (PET) is laminated on the upper portion of the second electrode of the organic light emitting display device. In other instances a cover or cap is formed using metal or glass including a moisture absorbent and is filled with a nitrogen gas and then the edge of the cover or cap is capsule-sealed with a sealing member such as epoxy.

However, the mentioned methods cannot prevent the intrusion of destructive factors such as moisture or oxygen by 100%. Also, processes to embody the methods are complicated. To address the above problem, a capsule sealing method to improve close adhesion between the device substrate and the cap using frit as a sealing member is developed.

Thus, as the organic light emitting display device is sealed by coating the frit on a glass substrate, the device substrate and the cap are completely sealed so that the organic light emitting display device may be more effectively protected. In the method of capsule sealing using frit, frit is coated on a sealing portion of each organic light emitting display device and a laser emitting apparatus moves to emit a laser beam to the sealing portion of the organic light emitting display device so that the frit is cured for sealing.

In the above-described conventional frit sealing system, although materials for the frit have been mainly developed in order to improve the quality of sealing, the quality of a laser beam that is emitted to resolve the frit has not been developed at all. However, in the frit sealing system, the uniformity of the laser substantially dominates the distribution of the temperature of seal so that the quality of sealing is greatly changed by a slight change in the temperature. Thus, a study to secure the uniformity of the laser beam emitted to the frit is urgently needed.

SUMMARY OF THE INVENTION

Some embodiments of the disclosure provide a frit sealing system configured to seal a light emitting layer of an organic light emitting display device. The system comprises a laser (laser generating apparatus) generating a laser beam and a homogenizer normalizing the intensity of the laser beam within a cross section of the laser beam in the transverse direction. Frit in the present disclosure comprises glass in a gel state by adding an organic material to the glass powder and is cured by uniformly distributed laser beam. The laser beam is configured to cure frit into a solid state to bind a first substrate and a second substrate together to form a package and seal. The frit sealing system is configured to provide sealing that inhibit the transfer of oxygen and/or moisture into the sealed area from the external environment. An embodiment of the present disclosure provides a frit sealing system. The frit sealing system comprises a laser configured to generate a laser beam, wherein an intensity of a laser beam is not normalized within a cross section in the transverse direction and a homogenizer in connection configured to normalize the intensity of the laser beam within the cross section of the laser beam. The system further comprises support apparatus configured to hold a first substrate with a top surface where the laser beam is incident on, a second substrate configured to be positioned below the first substrate, and frit interposed between the first and second substrate and configured to bind the first and the second substrates. The substrates are configured to package and seal light emitting layer in an organic light emitting display device.

The foregoing system may further comprise a connection member that transfers the laser beam generated by the laser to the homogenizer, wherein the connection member comprises at least one of a collimating lens and a focusing lens. In another embodiment the frit sealing system further comprises a focusing device comprising one or more lenses configured to focus the laser beam on a focal point at about the top surface of at least one of the substrates.

In one embodiment of the present disclosure, the laser comprises a multi-core source of a bundle type. In other embodiments the laser further comprises an attenuator configured to adjust the intensity of the laser beam.

The homogenizer of the frit sealing system comprises a multimode optical fiber in one embodiment. In another embodiment the homogenizer comprises a light pipe. Yet in another embodiment the homogenizer comprises a fly-eye lens. In some embodiments the homogenizer comprises an optical waveguide having a pair of reflective surfaces facing each other, wherein the laser beam inputted to the homogenizer is configured to be totally reflected in the homogenizer. In one of the embodiments the homogenizer may be integrated with a laser emitting device.

An embodiment of the present disclosure provides method of frit sealing utilizing the mentioned system. The method comprises generating a laser beam wherein the intensity of the laser beam is not normalized within a cross section of the laser beam in the transverse direction, normalizing the intensity of the laser beam within the cross section, emitting the laser beam on a top surface of a first substrate after frit is applied on the bottom surface of the first substrate and combining the first substrate with a second substrate wherein the frit is interposed between the substrates, moving the laser beam along an area on the top surface of the first substrate that traces the portions where the frit is applied on the bottom surface of the first substrate; and curing the frit via heat generated from the laser beam onto the first substrate and frit thereby solidifying and binding the first and second substrates together.

In the foregoing method the laser beam is generates heat in temperature range of from about 200° C. to about 600° C. within the laser beam emitted area, wherein the temperature generated within the laser beam emitted area is substantially uniform.

Still in the foregoing method the frit comprises glass powder and organic material mixed together to form a gel state, wherein the frit undergoes a burning process after being applied to the bottom surface of the first substrate before being combined with the second substrate. The cured frit solidifies and creates a seal between the first and the second substrates, wherein the frit is substantially free of micro scale cracks and substantially impermeable by oxygen and moisture.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF THE EMBODIMENTS

The attached drawings for illustrating exemplary embodiments of the present disclosure are referred to in order to gain a sufficient understanding of the present disclosure, the merits thereof, and the objectives accomplished by the implementation of the present disclosure. Hereinafter, the present disclosure will be described in detail by explaining exemplary embodiments of the disclosure with reference to the attached drawings. Like reference numerals in the drawings denote like elements.

First Embodiment

Figure 1:
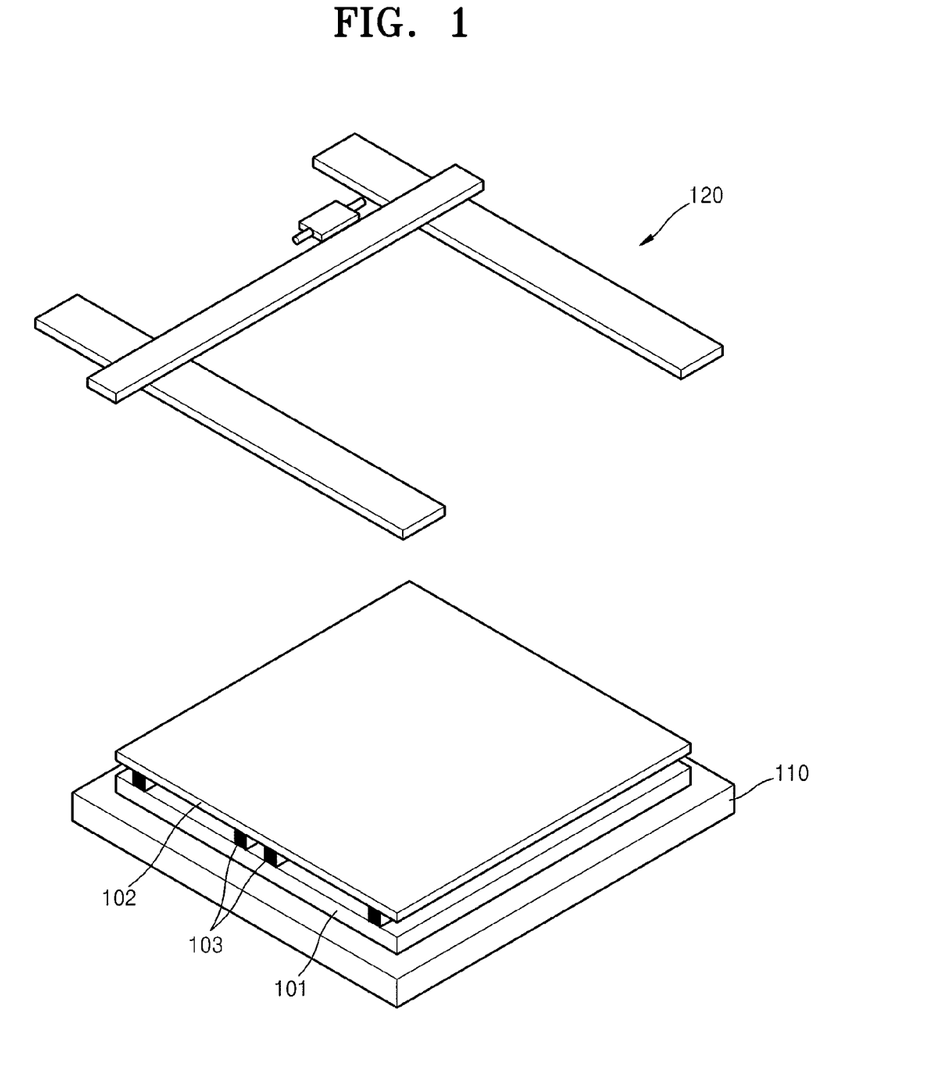
FIG. 1 illustrates a frit sealing system according to an embodiment of the present disclosure.

FIG. 1 illustrates a frit sealing system according to an embodiment of the present disclosure. In general, the term "frit" signifies glass in a powder state. In the present disclosure, however, frit collectively refers to glass in a gel state obtained by adding an organic material to the glass in a power state and also glass in a solid state cured by a laser beam.

Referring to FIG. 1, a frit sealing system according to the present embodiment includes a support apparatus 110 and a laser emitting member 120. A first substrate 101 and a second substrate 102 are seated on and above the support apparatus 110. A frit 103 is coated between the first and second substrates 101 and 102.

The laser emitting member 120 emits a laser beam to the frit 103 between the first and second substrates 101 and 102 to melt the frit 103 so that the first and second substrates 101 and 102 are combined to each other by the frit 103. A laser head (not shown) is supported by a laser head guide (not shown) and configured to be capable of moving above the first and second substrates 101 and 102.

A method of manufacturing an organic light emitting display device using the above frit sealing system is described below. First, the frit 103 is coated on the second substrate 102 and the frit 103 undergoes a burning (or firing) process. Then, the first and second substrates 101 and 102 are combined together. The frit 103 is cured by emitting a laser beam to the second substrate 102.

Figure 2:
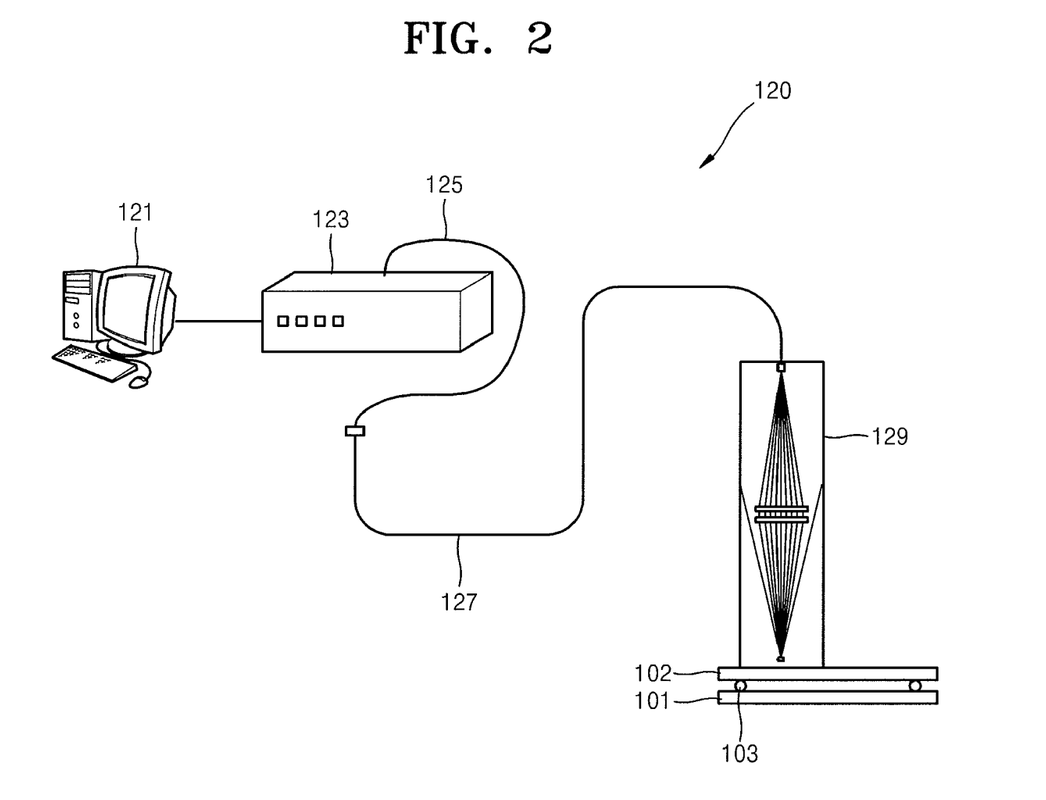
FIG. 2 schematically illustrates the structure of a laser emission member of the frit sealing system of FIG. 1.

FIG. 2 schematically illustrates the structure of a laser emission member of the frit sealing system of FIG. 1. Referring to FIG. 2, the frit sealing system according to the present embodiment includes a control PC 121, a laser (a laser generating apparatus) 123, a beam fiber 125, a homogenizer 127, and a focusing device 129.

The control PC 121 controls the operation of the laser emission apparatus 120, for example, laser emission strength, laser emission time, laser emission position, in the frit sealing system. The laser generating apparatus 123 generates a laser beam. A multi-core source of a bundle type that is a high power laser source generally used for laser sealing may be used as the laser generating apparatus 123.

The laser generating apparatus 123 may further include an attenuator (not shown). The attenuator adjusts the output intensity of a laser beam and transmits the adjusted laser beam to the beam fiber 125. In the process of sealing the frit using the laser beam, since the output of a laser beam changes according to a process time, the output of a laser beam must be adjusted according to the process time for the optimization of a process condition. However, when the output intensity of a laser beam is adjusted by controlling the inner current of the laser generating apparatus 123, the characteristic of the laser beam may be changed so that the output of a laser beam can be adjusted by using the attenuator.

The beam fiber 125 is coupled to the laser (laser generating apparatus) 123 and transmits the laser beam generated by the laser generating apparatus 123 to the homogenizer 127. The homogenizer 127 homogenizes or normalizes the intensity of the laser beam generated by the laser generating apparatus 123 at the sectional surface of the laser beam. The homogenizer 127 will be described in detail later.

The focusing device 129 includes one or more lenses appropriately designed and focuses a laser beam in a particular area on the substrates 101 and 102, on an upper surface of each of the substrates 101 and 102, without being distorted according to the position in an emitted area.

A multi-core source of a bundle type that is a high power laser source generally used for laser sealing may be used as the laser generating apparatus 123. In the bundle type multi-core source, the output of each core may be slightly different. Even when some of bundle fibers are disconnected, the bundle type multi-core source can be used by slightly increasing voltage so that the total output can be constant. However, for a frit sealing system in which the uniformity or normalization of the intensity of a laser beam mainly dominates the distribution of the temperature used in sealing and the quality of sealing is changed much according to a slight change in the temperature. When the bundle type multi-core source is used to obtain a sufficient sealing power, it is difficult to obtain a quality laser beam so that a uniform sealing cannot be obtained. To address the problem, in the frit sealing system according to the present disclosure, it is a characteristic that the quality of sealing is improved by generating a laser beam of a uniform quality using the homogenizer.

Figure 3:
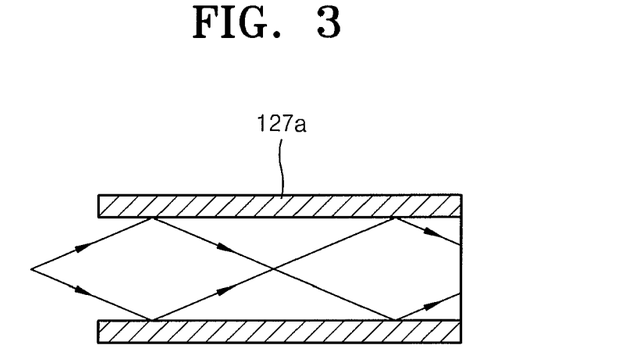
FIG. 3 illustrates a multimode optical fiber used as a homogenizer.
Figure 4A:
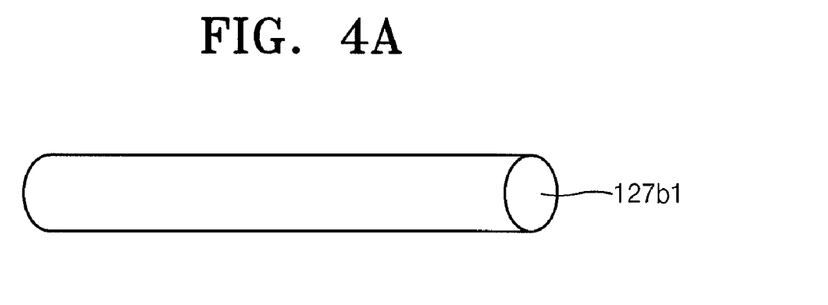
FIGS. 4A, 4B, 4C, and 4D illustrate light pipes used as a homogenizer.
Figure 4B:
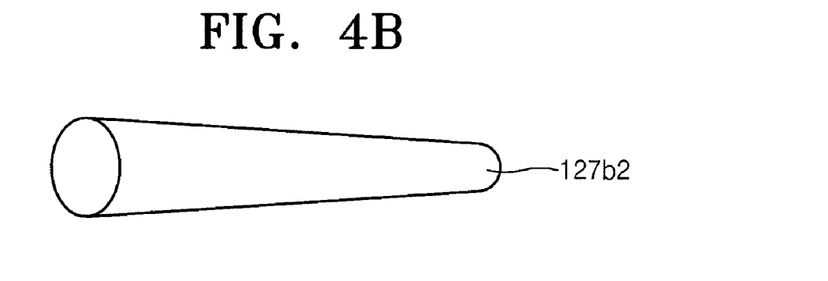
Figure 4C:
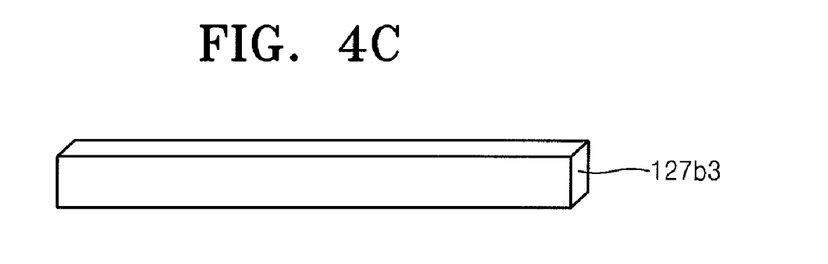
Figure 4D:
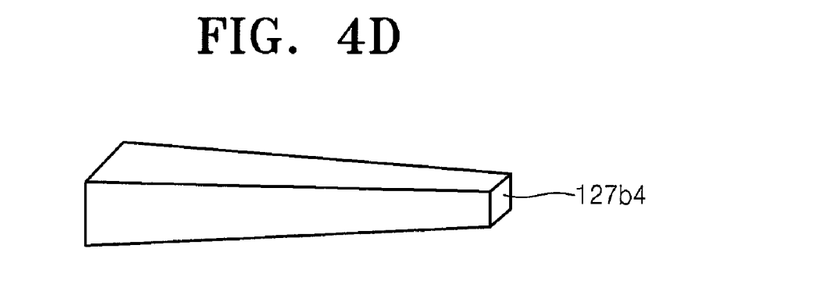

As shown in FIG. 3, the homogenizer 127 may be a multimode optical fiber 127a. When a homogenizer like the multimode optical fiber 127a is used, since an incident laser beam is transmitted through the multimode optical fiber 127a via a plurality of paths, the profile of a laser beam can be homogenized according to the length and curvature of the optical fiber 127a. Since the laser beam is reflected by a reflection surface of the optical fiber 127a, all incident laser beams arrive at an exit without being dispersed. In other words, when the laser beams exits optical fiber 127a, all laser beams arrive at the exit which would be dispersed when the optical fiber 127a does not exit. Thus, when the laser beam is incident on the optical fiber 127a, the laser beam is repeatedly reflected in the optical fiber 127a and arrives at the exit so that the input laser beam is homogenized.

The total reflection refers to a phenomenon that, when a light beam travels from an optically dense medium to an optically sparse medium, a light beam input by an incident angle greater than a particular critical angle is not refracted and reflected 100 percents. The optical fiber can reduce a loss rate when information is transmitted using the above principle. In detail, when a light beam travels input from an optically dense medium (a material having a relatively higher refractivity) to an optically sparse medium (a material having a relatively lower refractivity), if an incident angle is greater than a particular angle, the light beam is totally reflected by a boundary source between the optically dense medium and the optical sparse medium and no refractive light beam exists. This is the total reflection and the minimum value of the incident angle at which the total reflection may occur is referred to as the critical angle. For example, when a light beam travels from glass to air, the critical angle is about 42°. If the incident angle is greater than the critical angle, all light beams are reflected by a boundary surface to proceed back to the inside of the glass and does not proceed toward the air. A total reflection prism uses such a characteristic. As another example in the present disclosure, there is an optical fiber made by covering a glass fiber having a relatively higher refractivity with a glass layer having a relatively lower refractivity. Since the light beam input to an inner glass of the optical fiber repeats the total reflection, energy may be transferred a long distance without loss even when the optical fiber is bent.

Also, as shown in FIGS. 4A to 4D, the homogenizer may be a light pipe 127b. The light pipe 127b literally signifies sending light from a light source to a distant place and has a concept of allowing light, instead of water or oil, to flow in a pipe. The light pipe 127b may homogenize the profile of a laser beam by using the total reflection characteristic of a glass rod, adopting a principle similar to that of an optical fiber. FIGS. 4A to 4D illustrate a variety of shapes of the light pipe 127b.

Figure 5:
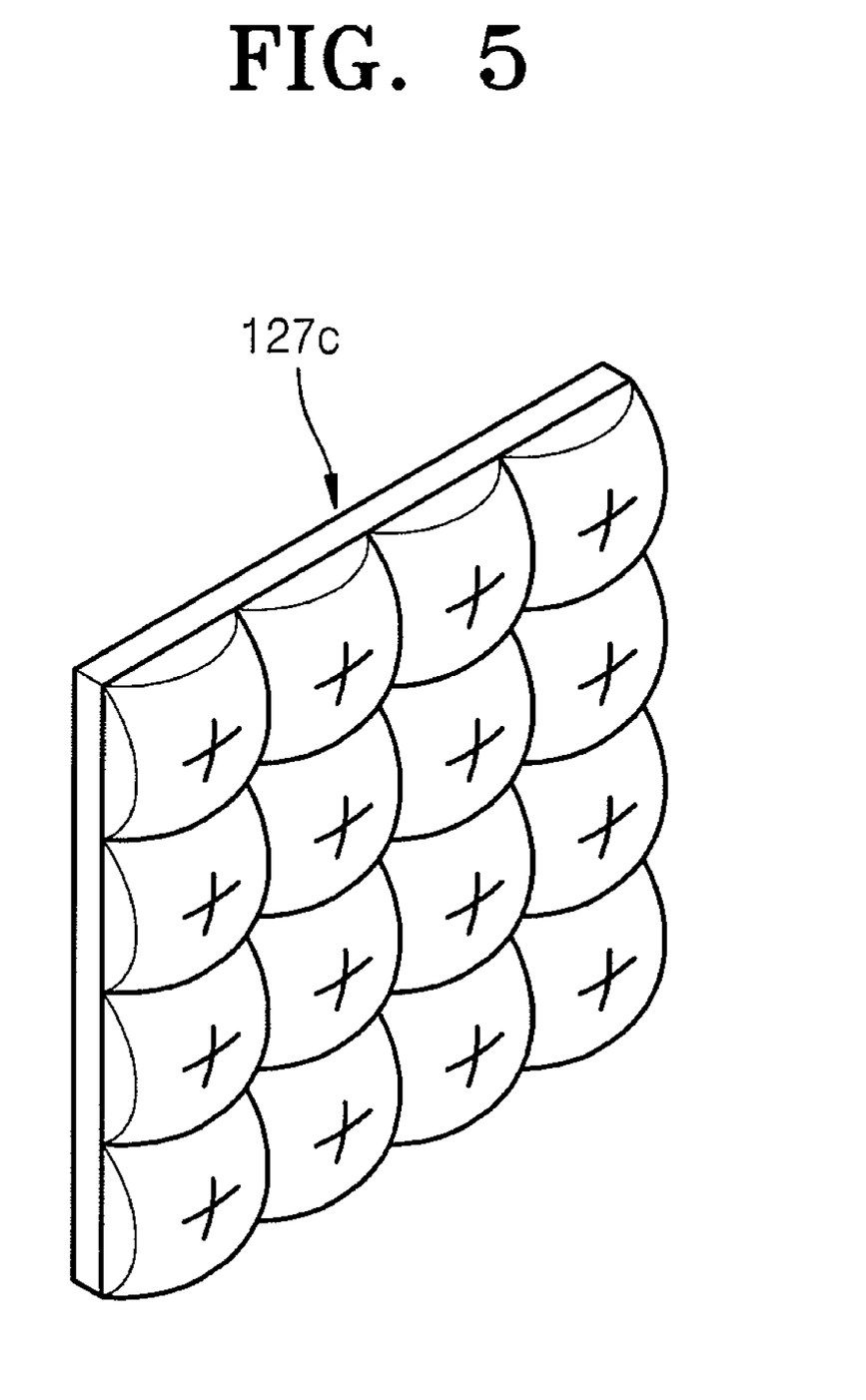
FIG. 5 illustrates a fly-eye lens used as a homogenizer.

As shown in FIG. 5, the homogenizer may be a fly-eye lens 127c for condensing incident light. That is, by extending a path of a laser beam using a microlens array like the fly-eye lens 127c, the profile of a laser beam may be homogenized.

Figure 6:
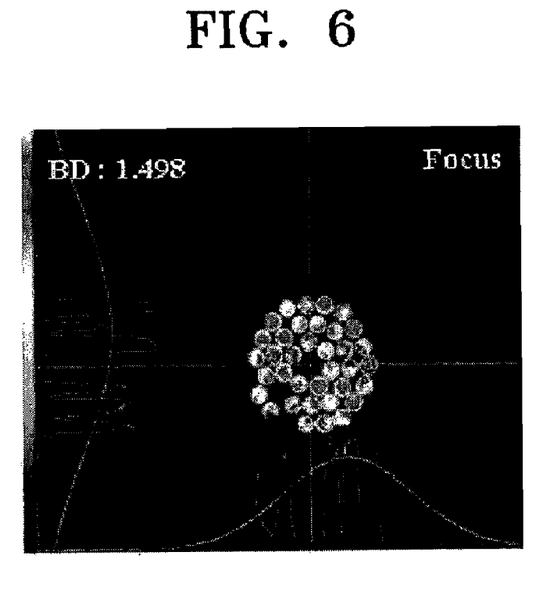
FIG. 6 is an image of a laser beam emitted by a multi-core source of a bundle type in a conventional frit sealing system.
Figure 7:
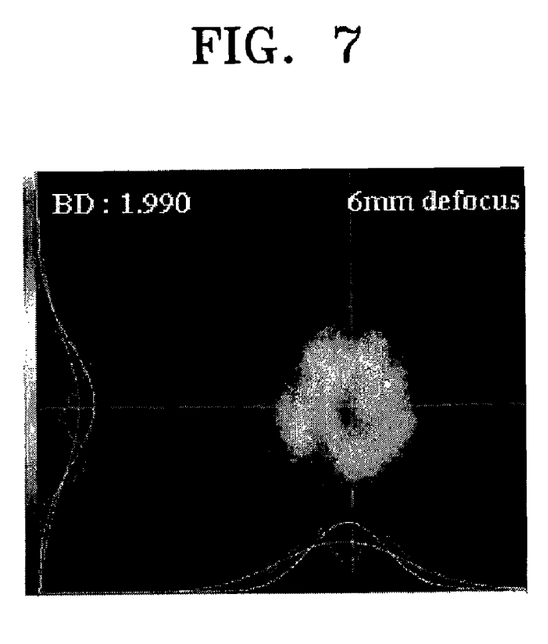
FIG. 7 is an image of a laser beam obtained by defocusing the laser beam of FIG. 6.
Figure 8:
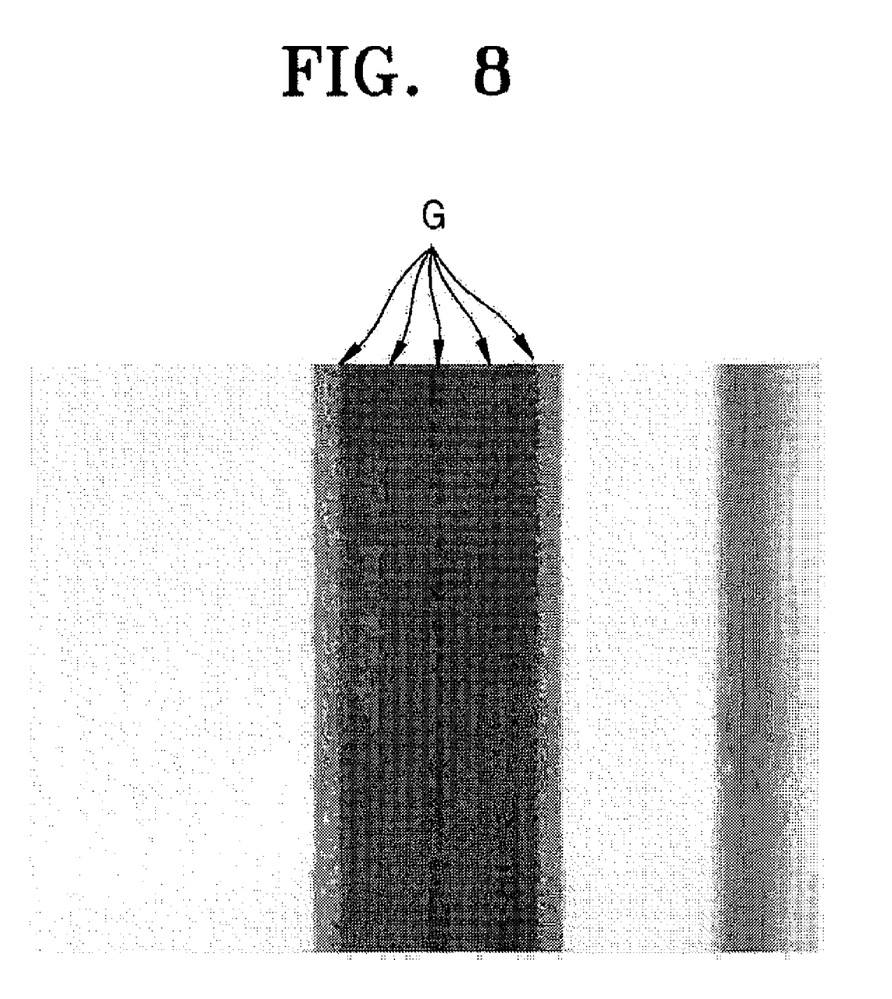
FIG. 8 is an image showing strip lines G on a glass frit as portions of relatively lower temperatures and portions of relatively higher temperatures are alternately arranged when the laser beam of FIG. 6 is used.
Figure 9:
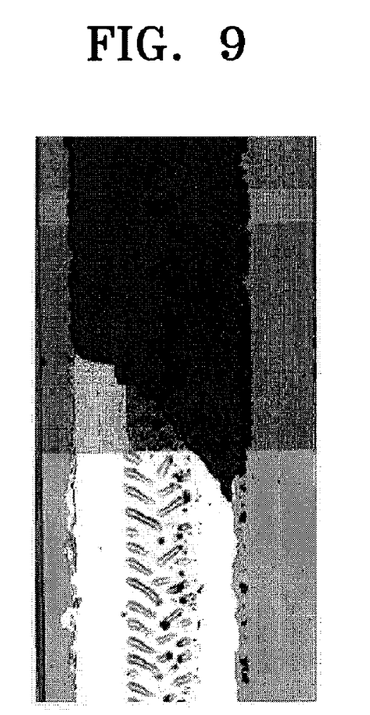
FIG. 9 is an image showing that a seal is ripped off after sealing when the laser beam of FIG. 6 is used.
Figure 10:
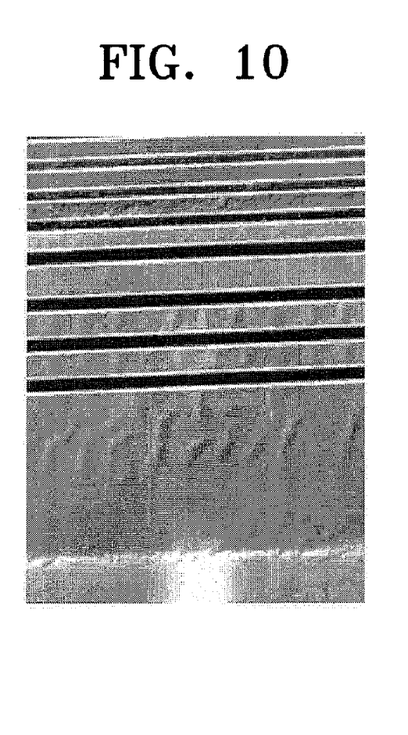
FIG. 10 is an image showing a plurality of micro-cracks generated when the laser beam of FIG. 6 is used.

FIG. 6 is an image of a laser beam oscillated by a multi-core source of a bundle type in a conventional frit sealing system. FIG. 7 is an image of a laser beam obtained by defocusing the laser beam of FIG. 6 to some degree. The images may be observed by using a beam profiler. As shown in FIGS. 6 and 7, when a laser beam oscillated by a bundle type multi-core source is used without being homogenized, the normalization of the intensity of the laser beam is not obtained. When the laser beam is actually used for sealing, as shown in FIG. 8, strip shaped lines G are generated on a glass frit as portions of relatively lower temperatures and portions of relatively higher temperatures are alternately arranged. Also, as shown in FIG. 9, a seal is ripped off after sealing when the laser beam of FIG. 6 is used. As shown in FIG. 10, a plurality of microcracks is generated due to heat variations within an area of laser emission when the laser beam of FIG. 6 is used. That is, when the laser beam oscillated by the bundle type multi-core source is not homogenized, complete sealing is not available because the quality of a laser beam at a focused area is not good due to variance in the intensities within the area. Thus, a quality laser beam with normalized intensity sufficient for sealing may be obtained only by defocusing the laser beam. Furthermore, it is a problem that obtaining a quality laser beam is not guaranteed in spite of the defocusing of the laser beam.

Figure 11:
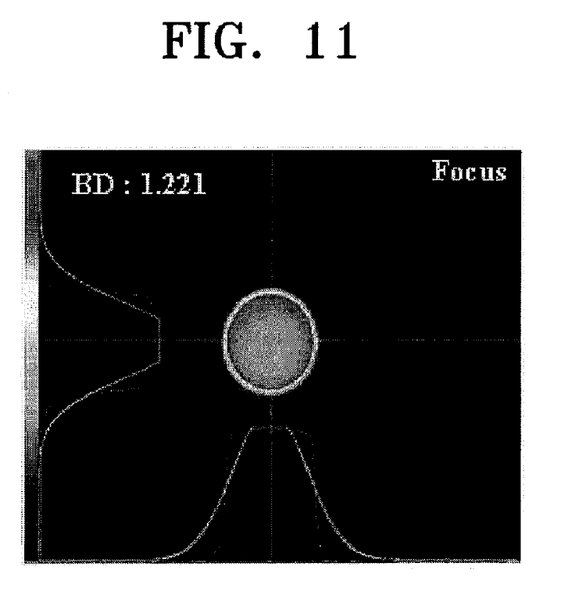
FIG. 11 is an image of a laser beam that is emitted by a multi-core source of a bundle type and homogenized by passing through a homogenizer in a frit sealing system according to an embodiment of the present disclosure.
Figure 12:
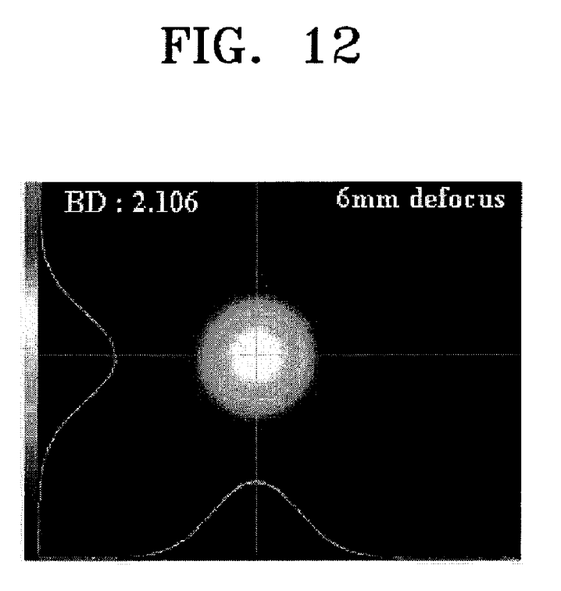
FIG. 12 is an image of a laser beam obtained by defocusing the laser beam of FIG. 11.
Figure 13:
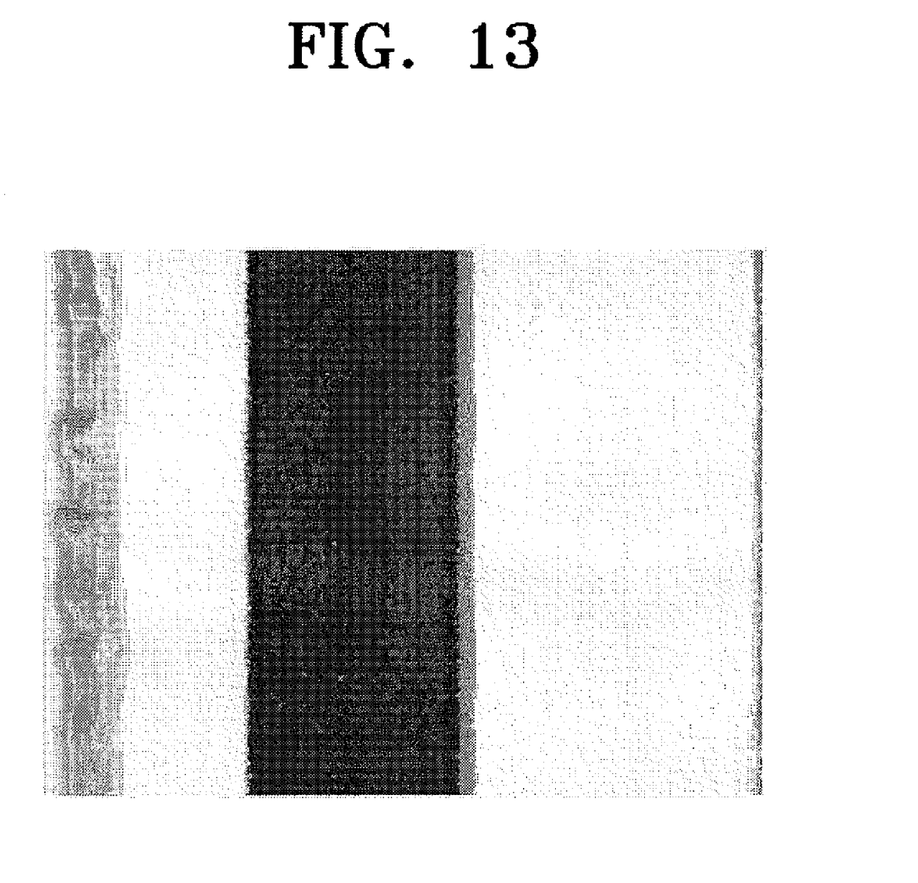
FIG. 13 is an image showing a state in which no strip line is generated in a glass frit and a clean sealing is achieved while the temperature of a sealing portion is uniformly maintained, when the laser beam of FIG. 11 is used.

FIG. 11 is an image of a laser beam that is generated by a multi-core source of a bundle type and homogenized by passing through a homogenizer in a frit sealing system according to an embodiment of the present disclosure. FIG. 12 is an image of a laser beam obtained by defocusing the laser beam of FIG. 11 to some degree. As shown in FIGS. 11 and 12, when homogenization is performed by passing the laser beam generated by the bundle type multi-core source through the homogenizer, the normalization of intensity of the laser beam within a cross section of the laser beam may be obtained. When the laser beam is actually used in sealing, as shown in FIG. 13, the temperature at a sealing portion is maintained with substantially no variance and strip shaped lines are not generated in a glass frit so that a clean and complete sealing is obtained. According to the above-described frit sealing system according to the present embodiment, the quality of sealing is improved and the long-term reliability of a cell used in an organic light emitting device is improved.

Second Embodiment

Figure 14:
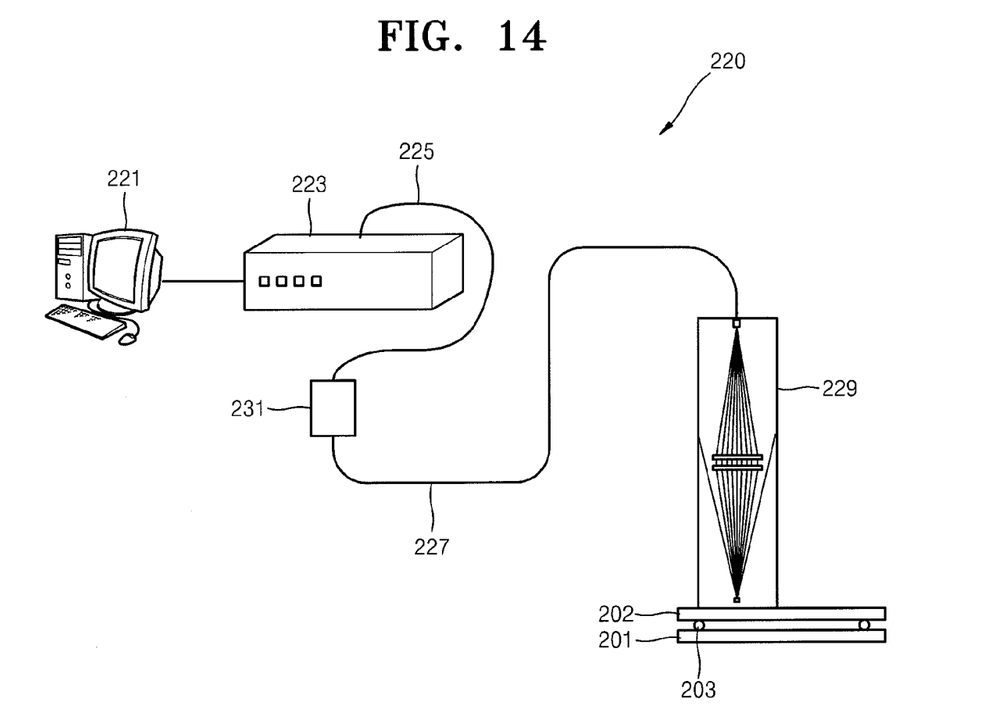
FIG. 14 schematically illustrates a frit sealing system according to another embodiment of the present disclosure.
Figure 15:
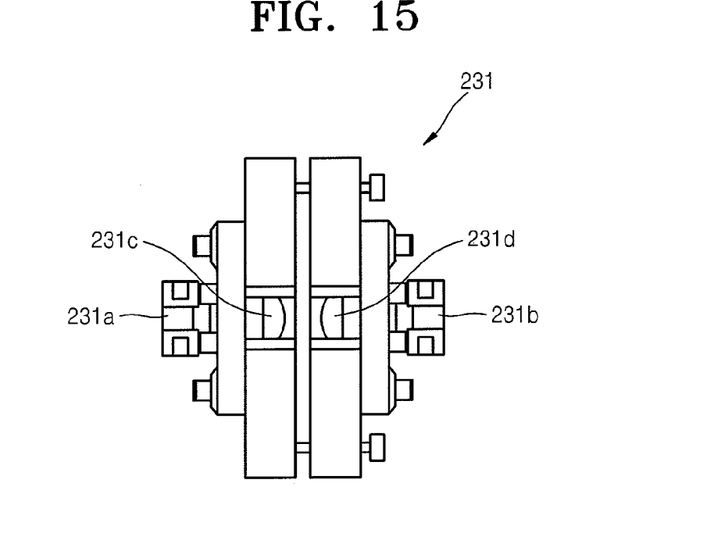
FIG. 15 illustrates a connection member of FIG. 14.

FIG. 14 schematically illustrates a frit sealing system according to another embodiment of the present disclosure. FIG. 15 illustrates a connection member of FIG. 14. Referring to FIG. 14, a frit sealing system 220 according to the present embodiment includes a control PC 221, a laser (laser generating apparatus) 223, a beam fiber 225, a homogenizer 227, a focusing device 229, and a connection member 231. The control PC 221 controls the operation of a laser emission apparatus 220, for example, the laser emission strength, the laser emission time, and the laser emission position of the frit sealing system.

The laser generating apparatus 223 generates a laser beam. A multi-core source of a bundle type that is a high power laser source and generally used for laser sealing may be used as the laser generating apparatus 223. The laser generating apparatus 223 may further include an attenuator (not shown). The attenuator adjusts the output intensity of a laser beam and transmits the adjusted laser beam to the beam fiber 225. Since the output of a laser beam in the process of sealing frit by using the laser beam changes according to the process time, the output of a laser beam needs to be adjusted according to the process time for the optimization of a process condition. However, when the output of the laser beam is adjusted by controlling an internal current of the laser generating apparatus 223, the characteristic of a laser beam that is oscillated may be changed so that the output of the laser beam may be adjusted by using the attenuator.

The beam fiber 225 is coupled to the laser generating apparatus 223 and transmits a laser beam generated by the laser generating apparatus 223 to the connection member 231. The connection member 231 more efficiently transfers the laser beam received through the beam fiber 225 to homogenizer 227. The connection member 231 will be described later with reference to FIG. 15.

The homogenizer 227 homogenizes the strength or intensity of the laser beam generated by the laser generating apparatus 223 at a cross section of the laser beam. Since a uniform quality laser with normalized intensity is generated by using the homogenizer 227, the quality of sealing may be improved. As described above, a multimode optical fiber, a variety of light pipes, or a fly-eye lens may be used as the homogenizer 223. Accordingly, the quality of sealing is improved by the homogenizer 223 so that the long-term reliability of a cell used in organic light emitting device is improved.

The focusing device 229 includes one or more appropriately designed lens. A laser beam scanned and incident on a particular area on substrate 201 and 202 is focused on an upper surface of each of the substrates 201 and 202 without being distorted according to the position in an emission area. As the frit 203 between the first and second substrates 201 and 202 is cured by the laser beam focused by the focusing device 229, the first and second substrates 201 and 202 are coupled to each other.

Referring to FIG. 15, the connection member 231 includes an input portion 231a, an output portion 231b, a collimating lens 231c, and a focusing lens 231d. A laser beam received from the beam fiber 225 through the input portion 231a passes through the collimating lens 231c and the focusing lens 231d and is output toward the homogenizer 227 via the output portion 231b. In one embodiment, as shown in FIGS. 14 and 15, the input portion 231a has a first opening that is directly connected to the beam fiber 225, and the output portion 231b has a second opening that is directly connected to the homogenizer 227. Also, as shown in FIG. 15, the collimating lens 231c resides in a first housing and the focusing lens 231d reside in a second housing. As shown in FIG. 15, the first housing is closer to the input portion 231a than the output portion 231b. Also, the second housing is closer to the output portion 231b than the input portion 231a. In one embodiment, as shown in FIG. 15, the first and second housings are spaced apart from each other via, for example, a connection screw.

The collimating lens 231c converts an incident laser beam to a parallel beam. The laser beam output from the laser generating apparatus 223 is divergent and the divergent laser beam is condensed as it passes through the collimating lens 231c. Thus, a parallel beam is obtained from the laser beam by using the collimating lens 231c, or the laser beam is condensed as necessary. The lens that converts the laser beam output from the laser generating apparatus 223 to a parallel beam is referred to as a collimating lens. The focusing lens 231d converges the laser beam that is converted to a parallel beam as it passes through the collimating lens 231c.

Thus, an irregular multi-core laser beam generated from the bundle type multi-core source is made parallel and condensed by using the connection member 231 and is transferred to the homogenizer 227 so that an efficiency in homogenizing or normalizing the intensity of the laser beam using the homogenizer may be further improved.

As described above, according to the frit sealing system according to the present disclosure, the quality of sealing is improved and thus the long-term reliability of a cell is improved.

While this disclosure has been particularly shown and described with reference to exemplary embodiments thereof, it will be understood by those skilled in the art that various changes in form and details may be made therein without departing from the spirit and scope of the disclosure as defined by the appended claims.

What is claimed is:

1. A frit sealing system comprising:
a laser generating apparatus, wherein an intensity of a laser beam generated thereby is not normalized within a cross section in the transverse direction;
a homogenizer configured to normalize the intensity of the laser beam within the cross section of the laser beam;
a support apparatus configured to hold a first substrate with a top surface where the laser beam is incident on, a second substrate positioned below the first substrate, and frit interposed between the first and second substrate and configured to bind the first and the second substrates;
a focusing device connected to the homogenizer and comprising one or more lenses configured to focus the laser beam on a focal point at about the top surface of at least one of the substrates;
a control computer configured to control a laser emission position of the focusing device;
a beam fiber connected to the laser generating apparatus; and
a connection member that transfers the laser beam generated by the laser generating apparatus to the homogenizer, wherein the connection member comprises i) an input portion that has a first opening directly connected to the beam fiber and is configured to receive the laser beam from the laser generating apparatus, ii) a collimating lens residing in a first housing and configured to collimate the laser beam received from the input portion, iii) a focusing lens residing in a second housing and configured to converge the collimated laser beam and iv) an output portion that has a second opening directly connected to the homogenizer and is configured to pass the converged beam through to the homogenizer, and wherein the first opening, the collimating lens, the focusing lens and the second opening are substantially aligned with each other.

2. The frit sealing system of claim 1, wherein the homogenizer comprises a multimode optical fiber.

3. The frit sealing system of claim 1, wherein the homogenizer comprises a light pipe.

4. The frit sealing system of claim 1, wherein the homogenizer comprises a fly-eye lens.

5. The frit sealing system of claim 1, wherein the homogenizer comprises an optical waveguide having a pair of reflective surfaces facing each other.

6. The frit sealing system of claim 1, wherein the laser generating apparatus comprises a multi-core laser source.

7. The frit sealing system of claim 1, wherein the laser beam inputted to the homogenizer is configured to be totally reflected in the homogenizer.

8. The frit sealing system of claim 1, wherein the homogenizer comprises a homogenizer integrated with a laser emitting device.

9. The frit sealing system of claim 1, wherein the laser generating apparatus further comprises an attenuator configured to adjust the intensity of the laser beam.

10. The frit sealing system of claim 1, wherein the substrates are configured to package and seal light emitting layer in an organic light emitting display device.

11. The frit sealing system of claim 1, wherein the diameters of the first and second openings are smaller than those of the collimating lens and focusing lens.

12. The frit sealing system of claim 1, wherein the first and second housings are spaced apart via a connection screw.

13. A fit sealing system comprising:
a laser generating apparatus, wherein an intensity of a laser beam generated thereby is not normalized within a cross section in the transverse direction;
a homogenizer configured to normalize the intensity of the laser beam within the cross section of the laser beam;
a focusing device connected to the homogenizer and comprising one or more lenses configured to focus the laser beam on a focal point at a substrate on which fit is formed;
a beam fiber connected to the laser generating apparatus; and
a connection member that transfers the laser beam generated by the laser generating apparatus to the homogenizer, wherein the connection member comprises i) an input portion that has a first opening directly connected to the beam fiber and is configured to receive the laser beam from the laser generating apparatus, ii) a collimating lens residing in a first housing and configured to collimate the laser beam received from the input portion, iii) a focusing lens residing in a second housing and configured to converge the collimated laser beam and iv) an output portion that has a second opening directly connected to the homogenizer and is configured to pass the converged beam through to the homogenizer, and wherein the first opening, the collimating lens, the focusing lens and the second opening are substantially aligned with each other.

* * * * *